United States Patent [19]

Verlinden

[11] 4,414,574
[45] Nov. 8, 1983

[54] VIDEO AMPLIFIER WITH BLANK STRETCHING

[75] Inventor: Harry W. Verlinden, Waterloo, Canada

[73] Assignee: Electrohome Limited, Kitchener, Canada

[21] Appl. No.: 327,432

[22] Filed: Dec. 4, 1981

[30] Foreign Application Priority Data

Dec. 23, 1980 [GB] United Kingdom ............ 8041239

[51] Int. Cl.³ .......................................... H04N 5/14
[52] U.S. Cl. ............................... 358/184; 358/165; 358/220
[58] Field of Search ............ 358/32, 33, 164, 165, 358/168, 169, 170, 184, 220; 330/252, 254, 259, 260, 261

[56] References Cited

U.S. PATENT DOCUMENTS 3,458,652  7/1969  McMann .................... 350/164

FOREIGN PATENT DOCUMENTS 2347192  3/1975  Fed. Rep. of Germany ...... 358/184

Primary Examiner—Richard Murray
Attorney, Agent, or Firm—Sim & McBurney

[57] ABSTRACT

A video amplifier is provided whose mode of operation varies depending on the level of the video signal from a condition where maximum positive voltage is applied to the cathode of the cathode ray tube (CRT) to ensure blanking, through operation as a differential amplifier, and finally to operation as a common emitter amplifier over the full brightness level range of the display on the CRT screen.

3 Claims, 2 Drawing Figures

VIDEO AMPLIFIER WITH BLANK STRETCHING

BACKGROUND OF THE INVENTION

In the operation of an X-Y monitor or the like there are often substantial periods of time when the beam of the CRT is not being deflected and, indeed, where it is on the axis of the CRT and hence centered on a spot at the center of the screen of the CRT. For example, in a video game the beam of the CRT may be deflected off axis for only the first part of any given frame. For the remainder of the frame it is common practice to return the beam to the on axis position. Under these circumstances it is necessary for the beam to be blanked, otherwise a spot will appear at the center of the screen, and, if this condition persists, eventually the screen will become burned at the center thereof.

SUMMARY OF THE INVENTION

An aspect of the invention is as follows:

A video amplifier comprising first and second transistors having base, collector and emitter electrodes, means connecting said collector electrodes to a source of positive potential, means connecting said emitter electrodes to each other and via a resistive network to a terminal at a potential more negative than said positive potential, a network for biasing on one of said transistors, an input terminal connected to the base electrode of the other of said transistors, means for supplying to said input terminal a video input signal varying between a blanking level, a black level and a maximum brightness level, and an output terminal connected to said collector electrodes of said other transistor.

BRIEF DESCRIPTION OF THE DRAWINGS

This invention will become more apparent from the following detailed description, taken in conjunction with the appended drawings, in which.

DETAILED DESCRIPTION OF THE INVENTION INCLUDING THE PREFERRED EMBODIMENT

Figure 2:
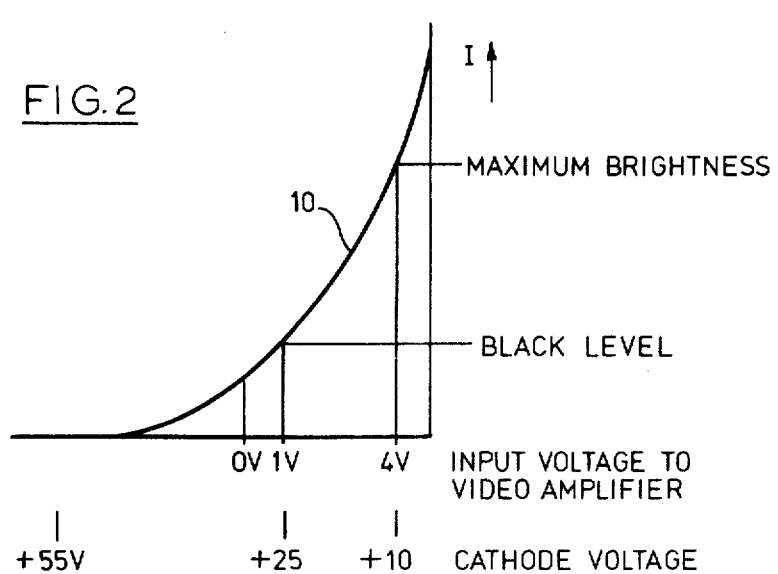
FIG. 2 is the characteristic curve ($I_B$ vs $V_{G1K}$) of of a cathode ray tube.

Referring first to FIG. 2, the characteristic non-linear curve of a CRT is shown at 10. Maximum brightness is specified to occur at a video amplifier input signal level of +4 volts and would typically require a potential difference between grid one and cathode of the CRT of −10 volts, while black level is specified to occur at a video amplifier input signal of +1 volt, which would typically require a potential difference between grid one and cathode of the CRT of −25 volts. Effective blanking, which requires complete suppression of the cathode beam current of the CRT, is specified to occur at 0 volts video amplifier input signal. A video amplifier with a linear gain characteristic producing the potential differences between grid one and cathode of the CRT outlined hereinabove would produce a −30 volt potential difference at a video amplifier input level of 0 volts. As will be seen from FIG. 2, at 0 volts, which should correspond to blanking of the beam, there is still a finite beam current. This problem is overcome, in accordance with the instant invention, by ensuring that when a 0 volt input signal is applied to the input terminal of the video amplifier, the resulting $V_{G1K}$ is at a level corresponding to a cathode voltage of +55 volts (see FIG. 2), at which point beam current of the CRT is fully cut off.

Figure 1:
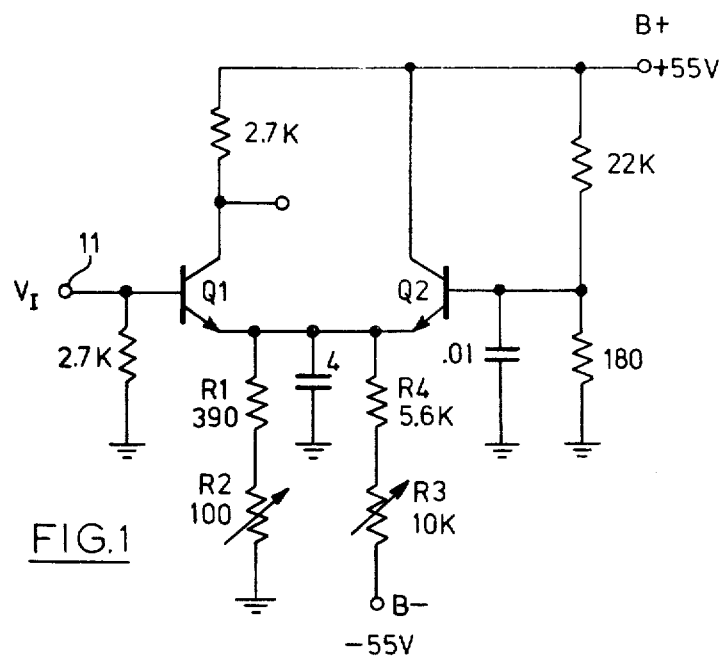
FIG. 1 is a circuit diagram of a video amplifier embodying the instant invention.

A video amplifier embodying this invention is shown in FIG. 1 and includes two identical transistors Q1 and Q2 which may be of the MPS U10 type. A video input signal $V_1$ varying from blanking level (0 volts), through black level (1 volt) to maximum brightness (4 volts) is applied to the input terminal 11 of the video amplifier, this input terminal being connected to the base of transistor Q1. The output terminal $V_0$ is connected to the collector of transistor Q1 and supplies its output to the cathode of a CRT (not shown). The emitters of transistors Q1 and Q2 are tied together and are connected via a resistor R1 and a white level control resistor R2 to ground. Connected between B− and the emitter of transistor Q2 is a black level control resistor R3 and a resistor R4.

In operation, with $V_1$ at 0 volts, transistor Q1 is non-conducting, transistor Q2 is biased on and conducting, $V_0$ is at B+ and CRT beam current is well cut off (see FIG. 2 for beam current level at a cathode voltage of +55 volts). When $V_1$ increases to about 0.5 volts, transistor Q1 begins conducting, transistor Q2 remains conducting, $V_0$ stays at B+ and the beam current is cut off. As $V_1$ increases from 0.5 volts, transistor Q1 becomes more conductive while conduction through transistor Q2 decreases. In this state the video amplifier operates in a differential mode at a very high gain. Before $V_1$ reaches the +1 volt level, transistor Q2 stops conducting, and the gain of the video amplifier is reduced from a maximum of about 50 (when in the differential mode) to about 6. In this mode the video amplifier is operating as a common emitter amplifier.

White level may be varied by adjusting resistor R2, while black level may be varied by adjusting resistor R3.

Those skilled in the art will understand that the polarities of transistors Q1 and Q2 may be reversed together with reversal of the B+ and B− potentials.

While a preferred embodiment of this invention has been disclosed herein, those skilled in the art will appreciate that changes may be made therein without departing from the spirit and scope of this invention as defined in the appended claims.

I claim:

1. A video amplifier comprising first and second NPN transistors having base, collector and emitter electrodes; means connecting said collector electrode of said first transistor to a source of positive potential via a first resistor; means connecting said collector electrode of said second transistor to a source of positive pontential; means for connecting said emitter electrode to each other and via a first resistive network to a source of negative potential and via a second resistive network including a variable resistor to a terminal at a potential less positive than said positive potentials and less negative than said negative potential; a network for biasing on said second transistor connected to said base electrode of said second transistor; an input terminal connected to the base electrode of said first transistor; means for supplying to said input terminal a video input signal varying between a blanking level, a black level and a maximum brightness level, the maximum brightness level being more positive than the black level and the black level being more positive than the blanking level; and an output terminal connected to said collector electrode of said first transistor.

2. A video amplifier comprising first and second NPN transistors having base, collector and emitter electrodes; means connecting said collector electrode of said first transistor to a source of positive potential via a first resistor; means connecting said collector electrode of said second transistor to a source of positive potential; means for connecting said emitter electrodes to each other and via a first resistive network including a variable resistor to a source of negative potential and via a second resistive network to a terminal at a potential less positive than said positive potentials and less negative than said negative potential; a network for biasing on said second transistor connected to said base electrode of said second transistor; an input terminal connected to the base electrode of said first transistor; means for supplying to said input terminal a video input signal varying between a blanking level, a black level and a maximum brightness level, the maximum brightness level being more positive than the black level and the black level being more positive than the blanking level; and an output terminal connected to said collector electrode of said first transistor.

3. A video amplifier according to claim 2 wherein said second resistive network includes a variable resistor.

* * * * *